(12) United States Patent
Haraguchi et al.

(10) Patent No.: US 6,276,892 B1
(45) Date of Patent: Aug. 21, 2001

(54) WAFER HANDLING APPARATUS

(75) Inventors: Hideo Haraguchi, Toyonaka; Izuru Matsuda, Kadoma, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/291,657

(22) Filed: Mar. 23, 1999

(30) Foreign Application Priority Data

Mar. 31, 1998 (JP) .................................................. 10-085500

(51) Int. Cl.[7] .................................................. B65G 49/07
(52) U.S. Cl. ......................... 414/744.5; 414/917; 901/19
(58) Field of Search ........................... 414/744.5, 744.6, 414/744.7, 917, 937; 901/19, 23

(56) References Cited

U.S. PATENT DOCUMENTS 5,064,340 * 11/1991 Genov et al. ................. 414/744.5
5,604,443 * 2/1997 Kitamura ........................ 414/937 X
5,720,590 * 2/1998 Hofmeister ................... 414/744.5
5,950,495 * 9/1999 Ogawa et al. .

* cited by examiner

Primary Examiner—Donald W. Underwood
(74) Attorney, Agent, or Firm—Price and Gess

(57) ABSTRACT

An upper arm 4 and a lower arm 6 of a parallel link system that perform extension and retraction action in the same direction without mutual interference are arranged within a vacuum enclosure 1. Three magnetic couplings are arranged coaxially at three levels, through which extension/retraction action and swivel action of upper and lower arms are effected. Using a cam box having three output shafts driven by a single input shaft to which an arm drive motor is connected, extension/retraction drive and Z axis drive of upper and lower arms are performed, while swiveling action of upper and lower arms is driven by a swivel motor.

11 Claims, 5 Drawing Sheets

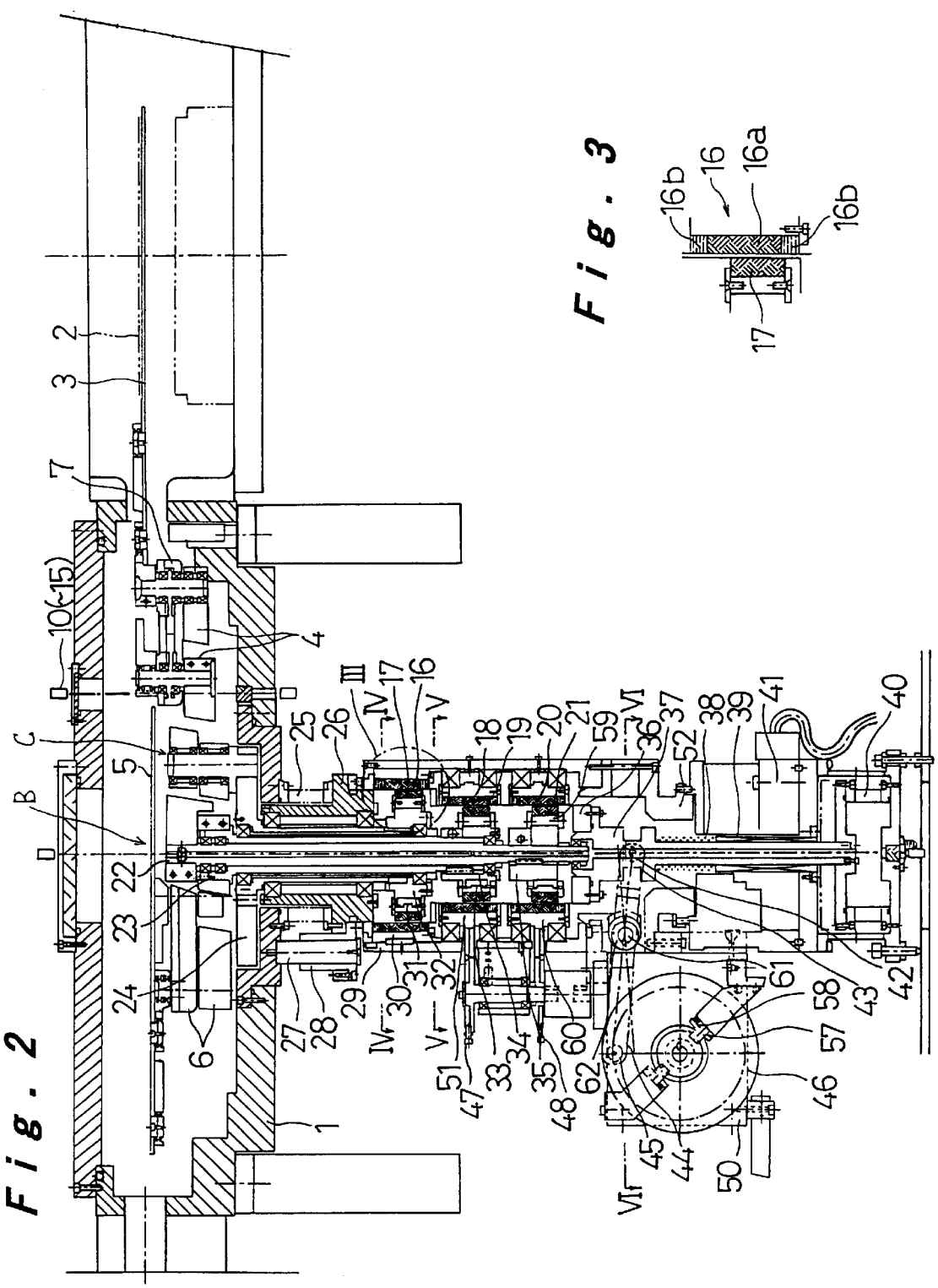

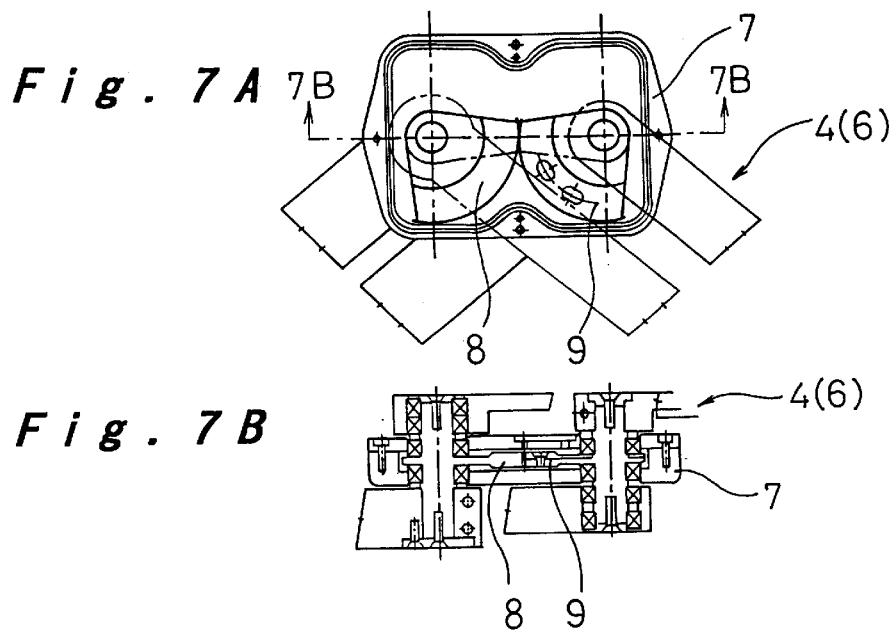
Fig. 7A
Fig. 7B
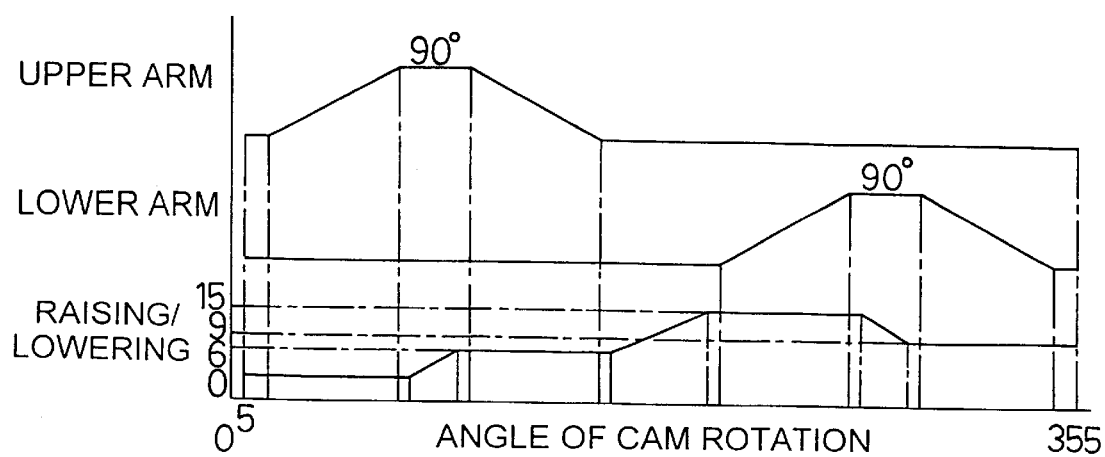
Fig. 8

WAFER HANDLING APPARATUS

BACKGROUND OF THE INVENTION

1. Field of the Invention

The present invention relates to a wafer handling apparatus and in particular relates to a wafer feeder adapted for wafer feed in a vacuum enclosure.

2. Description of the Related Art

Conventionally, in order to perform a wafer exchange operation, as shown in FIG. 9 and FIG. 10, equipment is known in which a blade 74 carrying a wafer is mounted at the tip of an arm 71 comprising a pair of freely bendable bending links 72, 73 which are symmetrically arranged, the base ends of bending links 72, 73 being supported so that they are rotatable in the peripheral direction, and the base ends of these bending links 72, 73 being respectively driven in rotation by drive motors 77, 78 and magnetic couplings 75, 76 arranged on two vertical levels. Since bending links 72, 73 have respectively independent drive axes, the equipment is constituted so as to sense their operations individually. Also, in the case of equipment where a plurality of arms 71 are arranged vertically, a complicated construction is provided below the arms to synchronize vertical drive of the arms in order to cut the number of drive axes.

Also, in the case of a single-direction double arm constituted such that a plurality of arms perform extension/retraction operation individually and towards a station in one direction, the blades of the upper and lower arm overlap during arm contraction, so, since it is not possible to use a transmission type sensor to identify on which blade the wafer is mounted, a reflective type sensor is arranged close to the blades.

However, the above prior art construction was subject to the problems that complicated control was required and the cycle time was made long since the operations of each drive shaft were sensed individually. Also, there was the problem that the swiveling radius became large due to the provision of a complex synchronization mechanism below the arm, and, with increasing wafer size, there was the problem that the mechanism itself tended to become of large size due to the need to strengthen the arm links, and a heavy object had thus to be raised and lowered.

Also, if a reflective type sensor was arranged close to the blade, there was the risk of interference with the wafer, blade or arm, etc. There was also a problem of unstable sensing occasionally caused by color differences on the surface of the wafer. To deal with these problems, a transmission type sensor could be arranged at some point along the path of extension/retraction of the arm and at each station, so as to detect which arm was extended and whether a wafer was placed thereon, but, if this was done, when the arm was driven, there was a risk of spurious detection due to the arm or blade passing over the transmission type sensor. This meant that the arm had to be stopped midway, or a time restriction monitored by a timer had to be imposed, leading to the problems of complicating the control operation and lowering the reliability of wafer sensing.

SUMMARY OF THE INVENTION

In view of the foregoing, an object of the present invention is to provide a wafer handling apparatus wherein the swiveling radius can be made small, drive of a single-direction double arm being achieved by a straightforward and compact mechanism, wherein the raising/lowering mechanism section can be reduced in weight, wherein high-speed feed can be achieved with a straightforward synchronization control, and wherein detection of the presence of a wafer can be performed with high reliability using a transmission-type sensor.

A wafer handling apparatus according to the present invention comprises: an upper double arm and a lower double arm, both being of a parallel link system, that are arranged within a vacuum enclosure and perform extension and retraction action in the same direction without mutual interference; a plurality of magnetic couplings arranged on an identical axis, through which drive of the respective extension/retraction action and swivel action of said upper and lower double arms are effected, whereby wafers can be delivered to a plurality of stations having a center point that coincides with said axis of the magnetic couplings in the vacuum enclosure; thus drive of a single-direction double arm can be effected with an uncomplicated and compact mechanism and the swiveling radius can be made small.

Also, by arranging upper and lower arm raising/lowering drive means below the magnetic couplings, the weight of the raising/lowering mechanism portion can be made small and generation of dust can be suppressed.

Also, by providing a cam box that drives three output shafts by a single input shaft, extension/retraction drive and raising/lowering drive of the upper and lower arms being performed by output shafts of the cam box, the wafer exchange operation being performed by a single arm drive motor and a swivel motor, high-speed feed can be achieved with uncomplicated synchronization control.

Also by providing detectors that identify whether a wafer is mounted on either of the upper and lower arms, arms using the parallel link system being employed, the presence of a wafer can be detected with high reliability using a transmission type sensor.

Also if detectors are arranged respectively in the directions of the vertices of a polygon in a polygonal vacuum enclosure wherein stations are arranged at each side, detectors can be shared by adjacent stations, making it possible to achieve high-reliability detection with a minimum number of detectors.

Also, if the speed of extension/retraction and the speed of swiveling of the upper and lower arms is altered in response to whether or not a wafer is carried, generation of dust can be reduced.

These and other objects, features and advantages of the invention will become more apparent upon a reading of the following detailed description and drawings.

BRIEF DESCRIPTION OF THE DRAWINGS

FIG. 2 is a vertical cross-sectional view of the above embodiment;

FIG. 3 is an enlarged view of part III of FIG. 2;

FIG. 7A is a plan view, and FIG. 7B is a cross-sectional view along the line 7B—7B of FIG. 7A, showing a detail of the arm articulation of this embodiment;

FIG. 8 is a cam timing chart of the upper and lower arm extension/retraction drive and raising/lowering drive in this embodiment;

DESCRIPTION OF PREFERRED EMBODIMENTS

An embodiment of a wafer handling apparatus according to the present invention is described below with reference to FIG. 1~FIG. 8.

Figure 1:
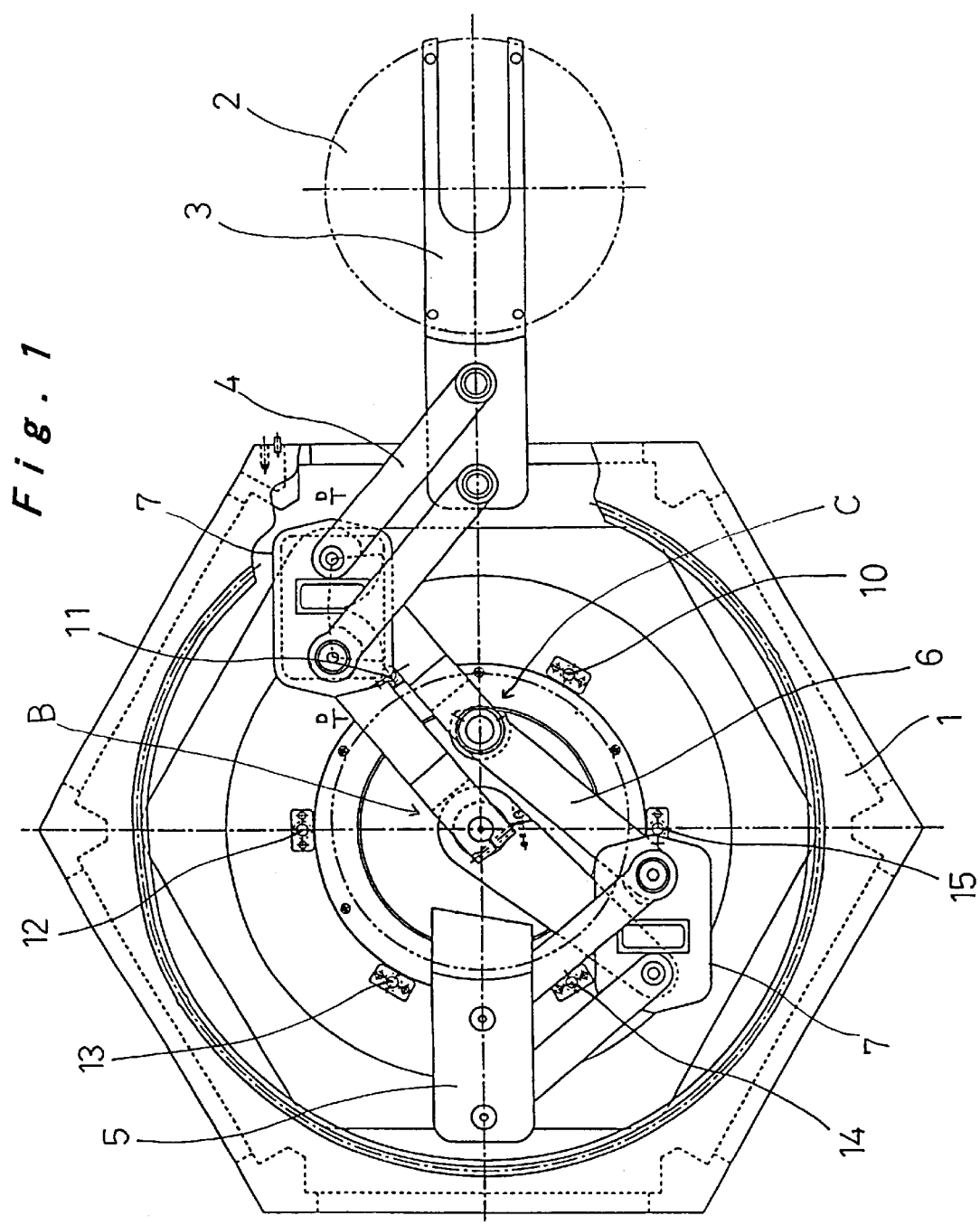
FIG. 1 is a plan view showing one embodiment of a wafer handling apparatus according to the present invention.
Figure 4:
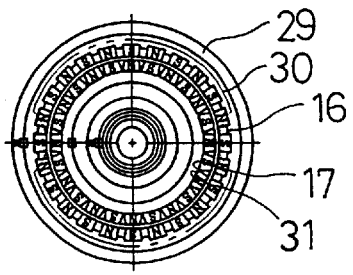
FIG. 4 is a cross-sectional view along the line IV—IV of FIG. 2.
Figure 5:
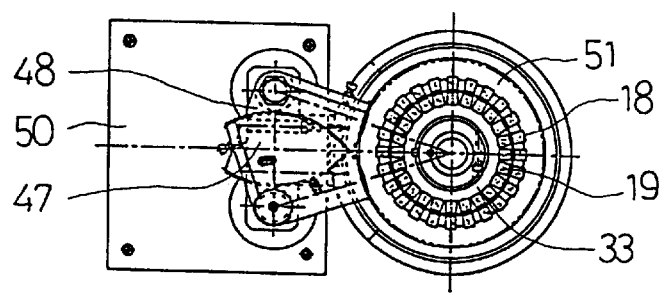
FIG. 5 is a cross-sectional view along the line V—V of FIG. 2.

In FIG. 1 and FIG. 2, parallel link-type upper double-arm 4 and lower double arm 6 having their respective articulating sections 7 in an intermediate portion thereof are arranged within a hexagonally-shaped vacuum enclosure 1 in which there are provided respective stations corresponding to each side of the periphery. These arms 4, 6 are unidirectional double arms and constituted so as to operate by extension/retraction towards stations in one direction individually and jointly. One base end B of these parallel link-type upper arm 4 and lower arm 6 is supported in such a manner that it can be driven in rotation in a coaxial condition at an axial central position of swivel stage 24 which is arranged so as to be capable of swiveling at the center of vacuum enclosure 1, while the other base end C is freely rotatably supported in coaxial condition at a position offset from the axial position of swivel stage 24. At the tips of upper arm 4 and lower arm 6, there are mounted an upper arm blade 3 and lower arm blade 5 which carry respective wafers 2. The construction is such that the wafers 2 on either blade 3, 5 can be fed in a linear direction by extension/retraction action of upper arm 4 and lower arm 6. A parallel-link mechanism is constituted by incorporation of plain gearwheels 8, 9 arranged to mutually mesh, as shown in FIGS. 7A and 7B, at respective articulating sections 7 of arms 4, 6.

One base end B of upper arm 4 and lower arm 6 is respectively fixed to upper arm drive shaft 22 and lower arm drive shaft 23, which constitute concentric double shafts, these arm drive shafts 22, 23 being supported by a concentric flange 26 by means of concentric swivel stage 24. Also, bearings are relatively rotatably interposed between these arm drive shafts 22, 23, swivel stage 24 and flange 26. Flange 26 is supported on vacuum enclosure 1 in such a manner that it can be moved vertically by means of linear guide 28 and linear shaft 27, vacuum sealing of the raising/lowering mechanism being effected by means of bellows 25.

A transmission mechanism for extension/retraction and swivel drive of upper arm 4 and lower arm 6 is arranged below flange 26. Specifically, as shown in FIG. 2~FIG. 5, three magnetic couplings comprising outer wheel magnet 16 and inner wheel 17 for swiveling, outer wheel magnet 18 and inner wheel magnet 19 for extension/retraction drive of lower arm 6, and outer wheel magnet 20 and inner wheel magnet 21 for extension/retraction drive of upper arm 4 are arranged on the same vertical axis on three vertical levels. The diameters of these three magnetic couplings are set in accordance with the required torque and the position-locating accuracy.

The inner wheels of the three vertical level magnetic couplings are fixed through respective fixing brackets 32, 34, 35 to swivel stage 24, lower arm drive shaft 23 and upper arm drive shaft 22. Specifically, at the upper level, swiveling inner wheel magnet 17, yoke 31 and fixed bracket 32 are arranged, in the middle level, lower arm drive inner wheel magnet 19, yoke 33 and fixed bracket 34 are arranged, and in the bottom level, lower arm drive inner wheel magnet 21, yoke 59 and fixed bracket 35 are arranged: these constitute the inner wheel assemblies.

The outer wheel assemblies of the three vertical level magnetic couplings are constituted by an outer sleeve 29, support 52 and swivel motor 41; upper-level swiveling outer wheel magnet 16 and yoke 30 are fixed to outer sleeve 29, middle-level lower arm drive outer wheel magnet 18 and yoke 51, and lower-level upper arm drive outer wheel magnet 20 and yoke 60 are freely rotatably supported on outer sleeve 29 by means of respective bearings. Also, plain gearwheels are formed on the outer peripheral face of the two outer wheel yokes 51, 60, these being meshed with plain gearwheels 47, 48 mounted on two output shafts of cam box 50.

Extension/retraction drive of upper arm 4 and lower arm 6 is effected by rotating outer wheel yokes 51, 60 of the magnetic couplings (magnets 18, 19, 20 and 21) by plain gearwheels 47, 48 that are mounted on respective output shafts of cam box 50. Rotation of outer wheel yokes 51, 60 is respectively transmitted through the inner wheel magnets 19, 21 of the magnetic couplings to lower arm drive shaft 23 and upper arm drive shaft 22, thereby rotating the base ends of arms 4, 6 and so effecting extension/retraction operation of arms 4, 6. Also, in extension/retraction operation of upper arm 4 and lower arm 6, they can both be moved independently, the construction being such that swiveling with the swiveling radius made a minimum can be achieved by maximum contraction of upper arm 4 and lower arm 6.

Below the lower-level magnetic coupling, there is arranged a partition assembly comprising a partition 36 and linear shaft 37 mounted therebeneath by means of an O-ring seal. The bottom end of upper arm drive shaft 22 is freely rotatably supported by linear shaft 37 through a bearing. Linear shaft 37 is supported in such a manner that it is free to displace in the vertical direction by a linear guide 39 mounted in a hollow region of swivel motor 41 consisting of a DD motor, and the weight of the inner wheel assemblies and partition assembly is supported by compression spring 38. The upper face of bellows 40 is connected to the bottom end of linear shaft 37, the construction being such that the load in the Z axis direction is unchanged whether the interior of the partition assembly is under vacuum or at atmospheric pressure.

Figure 6:
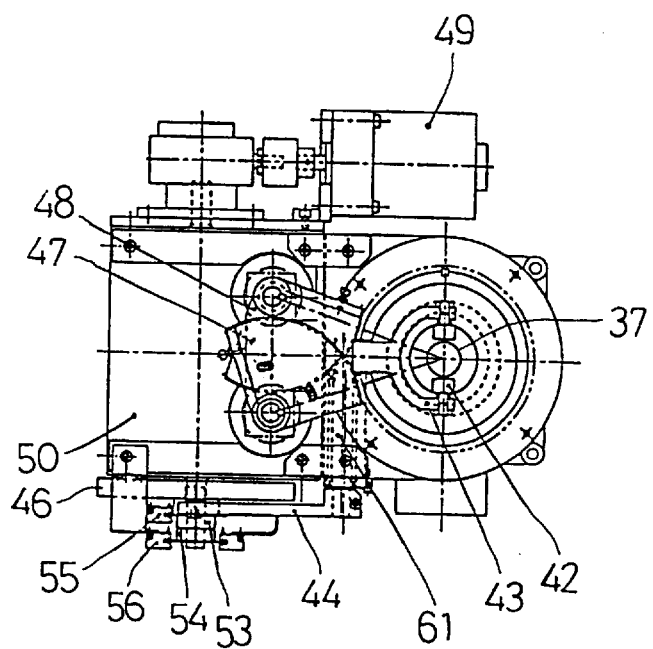
FIG. 6 is a cross-sectional view along the line VI—VI of FIG. 2.
Figure 9:
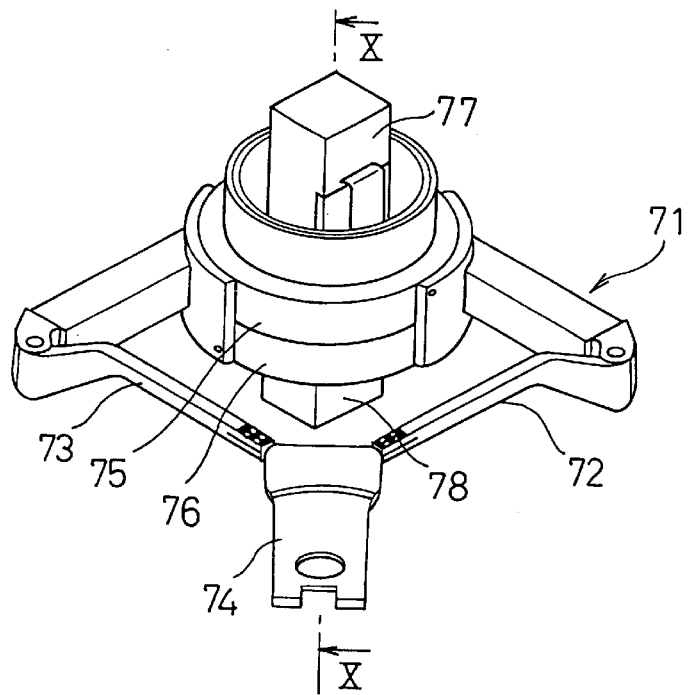
FIG. 9 is a perspective view of a prior art wafer handling apparatus.
Figure 10:
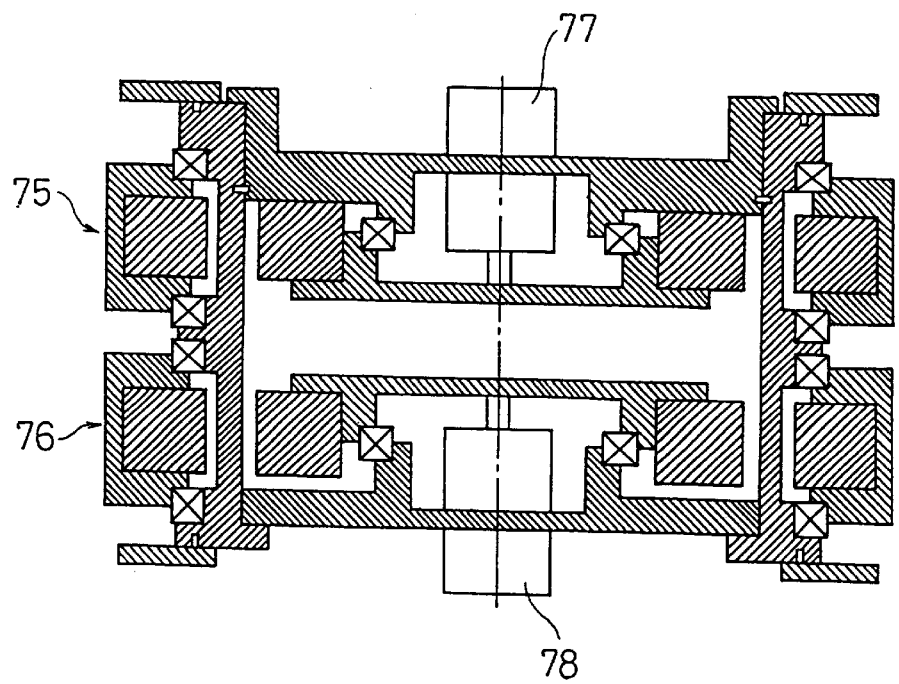
FIG. 10 is a cross-sectional view along the line X—X of FIG. 9.

As shown in FIG. 2 and FIG. 6, cam box 50 is fixed to a support 52 arranged on top of swivel motor 41; an arm drive motor 49 consisting of a reversible motor is connected to its input shaft, while a groove cam disc 46 and dogs 53, 54 are mounted on output shaft issuing on the opposite side to the input shaft of cam box 50.

A shaft 61 is provided such as to pass through a support 62 which is formed in a corresponding hole through the interior of support 52. Levers 43 and 44 are both supported on one end thereof so that they are swingable about the shaft 61, the levers 43, 44 thereby constituting a link mechanism. Levers 43 and 44 have their respective cam followers 42 and 45 mounted on the tip thereof, the cam follower 42 of lever 43 being engaged with part of the groove of linear shaft 37, while the cam follower 45 of lever 44 being engaged with groove cam disc 46. By this arrangement, when the groove cam disc 46 is driven by arm drive motor 49 to rotate, the link mechanism constituted by levers 43, 44 and shaft 61 causes the partition assembly including linear shaft 37 to move upwards and downwards, thereby effecting Z axis drive of upper arm 4 and lower arm 6. The portion of linear shaft 37 that is engaged by cam follower 42 is cylindrical, so that, even if swiveling of the outer wheel assembly of the magnetic coupling takes place, torque cannot be transmitted to the partition assembly by rolling of cam follower 42.

Thus, upper arm 4 and lower arm 6 are driven for extension/retraction by rotation of plain gearwheels 47, 48 by the two output shafts at the upper face of cam box 50, by rotation of arm drive motor 49 that is connected to the input shaft of cam box 50, and upper and lower arms 4, 6 can be driven in the Z axis direction by rotation of groove cam disc 46. Extension/retraction drive of upper and lower arms 4, 6 and Z axis drive thereof can be thus performed by a single arm drive motor 49. Specifically, cam box 50 is constituted such that three output shafts are actuated with timing as in FIG. 8 by rotation of an input shaft, wafer replacement being performed by reciprocation of the input shaft from 5 degrees to 350 degrees.

Further, shaft 61 is supported on support 62 through bearings, and the axes of shaft 61 and support 62 are offset, so that height adjustment in the vertical direction of the partition assembly can be effected by rotating support 62 somewhat, within the hole of support 52.

Furthermore, in the magnetic couplings, the heights of outer wheel magnets 18, 20, 22 are made greater than the heights of inner wheel magnets 17, 19, 21 by at least the extent of the ascending/descending stroke, thereby ensuring the necessary torque between the Z axis strokes of the inner wheel magnets. Further, since this torque is very large, the magnetic circuit must be made very powerful, so the thrust that is generated by displacement from the balanced condition (corresponding centers of the inner and outer wheel magnets) during the Z axis stroke of the inner wheel magnets becomes extremely large. As a countermeasure, as shown in FIG. 3, for the outer wheel magnets 16 of the upper-level swivel magnetic coupling, magnets of different magnetic flux density are mounted at central part 16*a* and the two end parts 16*b* (the magnetic flux density of 16*b* being larger than that of 16*a*), so that the magnetic thrust towards a balanced position is buffered by the system of three magnetic coupling levels as a whole.

Dog 53 is provided for detecting the timing at which a wafer may be placed on arms 4, 6 and actuates sensor 55. The construction is such that the speed of rotation of arm drive motor 49 is changed over in accordance with detection results by combination of this sensor 55 and wafer detection sensors 10~15 (see FIG. 1), to be described. Specifically, generation of dust is reduced by lowering the arm drive speed when wafer detection sensors 10~15 detect a wafer 2 whilst sensor 55 outputs. Also, dog 54 is provided for detecting the origin positions of arms 4, 6, and the direction of rotation of arm drive motor 49 is recognized by detecting the dog 54 at the respective positions of origin 1 sensor 57, origin 2 sensor 58, and intermediate origin sensor 56.

Wafer detection sensors 10~15 consist of transmission type sensors. As shown in FIG. 1, they are arranged in the direction of each vertex of the hexagonal vacuum enclosure 1, two sensors being provided on both sides in the direction towards each station, one of these two sensors (10 in the case shown in FIG. 1) being arranged so as not to interfere with linearly moving blades 3, 5 or arms 4, 6. Also, by such a sensor arrangement, two sensors on both sides of the direction towards each station can be used by being shared with the station directions on both sides, respectively, enabling a minimum number of sensors to be employed.

The wafer detection operation using these wafer detection sensors 10~15 will now be described. By employing alternately two wafer detection sensors in the direction of the station faced by arms 4 and 6 (in the condition of FIG. 1, sensors 10 and 11), it is possible to recognize whether a wafer 2 is mounted on blade 3 or 5 immediately after arm 4 or 6 is driven to extend after maximum retraction, or during arm 4 or 6 is driven to retract after maximum extension.

For example, as shown in FIG. 1, when it is sought to extend upper arm 4 with empty blade 3 towards the station faced by arms 4 and 6, it can be ascertained that there is no wafer 2 on blade 3 by means of sensor 10 on the side where there is no interference at all with this blade 3 and upper arm 4. Also, when upper arm 4 that is carrying a wafer 2 is retracted, the sensor 10 detects that wafer 2 is placed on blade 3 of upper arm 4. Alternatively, sensor 11, which is in a symmetrical position with respect to sensor 10 on the other side of the line joining the center of vacuum enclosure 1 and the station, monitors the return of lower arm 6 with empty blade 5 after leaving wafer 2 at the station or when lower arm 6 carrying a wafer 2 on the other side is sought to be extended from the most retracted condition. In the case shown in FIG. 1, when upper arm 4 is retracted or extended, among sensors 10–15, the one that detects passing of wafer 2 alone thereabove is sensor 10, that is one of the two sensors 10, 11 on both sides of the station to which arms 4, 6 are facing; thus spurious detection cannot occur. In addition, when the wafer diameter becomes large, such as in the case of wafers of 8 inches or more, since the time that is detected by a transmission sensor becomes long, wafer detection can be performed even though the drive speed of arms 4, 6 is increased, and feeding with high reliability can be achieved.

Also, by employing a variable-speed arm drive motor 49, it is possible to suppress generation of dust from articulating portion 7 etc. by slowing down the drive speed of arms 4, 6 at the time point where wafer 2 on blade 3 or 5 which is moving in extension or retraction is detected, thereby making it possible to prevent dust adhering to wafer 2 whilst it is being fed.

As described above, since, in this embodiment, the extension/retraction action and swiveling action of upper and lower arms 4, 6 is performed by means of three magnetic couplings which are coaxially arranged, the swiveling radius of arms 4 and 6 can be reduced. Also, while Z axis drive is added in order to keep the feed height of wafer 2 by upper arm 4 and lower arm 6 fixed, both of extension/retraction and this Z axis drive of upper and lower arms 4, 6 are performed by means of a single arm drive motor 49 through cam box 50, wherefore there is no need to sense each individual operation, and wafer exchange can therefore be performed in a short time with high reliability. Also, thanks to the employment of magnetic couplings, the vacuum sealing of each drive transmission mechanism is of the noncontact type, so dust produced by feeding is decreased. Also, it is a feature of the three magnetic couplings that, during Z axis drive, only the inner wheel side is raised or lowered, the construction being such that the outer wheel side, where the swivel mechanism and arm drive means are provided, remains stationary; thus, miniaturization of the raising/lowering mechanism can be achieved.

Also, by disposing the arrangement positions of transmission-type sensors 10~15 in the direction of the vertices of a polygonal chamber whose sides correspond to the stages, as shown in FIG. 1, high-speed arm drive without spurious detection can be implemented.

It should be noted that the "wafers" in this specification, apart from actual semiconductor wafers, include all such items that need to be fed in vacuum, such as liquid crystal substrates. Also, although in the illustrated example, a hexagonal vacuum enclosure 1 for feeding was illustrated, vacuum enclosures of other polygonal shapes could of course be employed.

As described above, with a wafer handling apparatus according to the present invention, wafer exchange can be performed at high speed, reliably, and with low dust, and in a more space-saving manner. Also, high-speed, high-reliability wafer feed can be implemented, since all the operations of wafer feed can be performed by two drive systems, wafer exchange being performed by extension/retraction operation of upper and lower double arms by a single motor, while swiveling of the double arms being achieved by another motor.

While a preferred embodiment of the invention has been described using specific terms, such description is for illustrative purposes only, and it is to be understood that changes and variations may be made without departing from the spirit or scope of the following claims.

What is claimed is:

1. A wafer handling apparatus comprising:
   an upper double arm and a lower double arm, both being of a parallel link system, that are arranged within a vacuum enclosure and perform extension and retraction action in the same direction without mutual interference;
   an upper drive arm shaft connected to the upper double arm;
   a lower drive arm shaft connected to the lower double arm;
   a plurality of magnetic couplings arranged on an identical axis and operatively connected to move the respective upper and lower drive arm shafts, through which drive of the respective extension/retraction action and swivel action of said upper and lower double arms are effected, whereby wafers can be delivered to a plurality of stations having a center point that coincides with said axis of the magnetic couplings in the vacuum enclosure;
   a cam box having three output shafts operatively connected to the magnetic couplings and driven by a single input shaft; and
   a drive motor connected to said single input shaft for providing a drive force thereto, wherein extension/retraction drive and raising/lowering drive of the upper and lower double arms are performed through said output shafts of the cam box.

2. The waver handling apparatus according to claim 1, wherein the raising/lowering drive is transmitted to the upper and lower double arms through a drive shaft arranged below the magnetic couplings and operatively connected to the drive motor through a link mechanism.

3. The wafer handling apparatus according to claim 1, wherein detectors are mounted adjacent the upper and lower double arms to identify where a wafer is mounted on either of the upper and lower double arms.

4. The wafer handling apparatus according to claim 1, wherein the vacuum enclosure is formed of a polygonal configuration, and detectors that identify whether a wafer is mounted on either of the upper and lower double arms are arranged respectively adjacent vertices of the polygonal configuration in the polygonal vacuum enclosure.

5. The wafer handling apparatus according to claim 3, further including speed control means for controlling the speed of the upper and lower double arms wherein the speed of extension/retraction and the speed of swiveling of the upper and lower double arms are altered in response to whether or not a wafer is carried on either of the upper and lower double arms.

6. A waver handling apparatus comprising:
   an upper double arm of a parallel link system having a rotation axis at one end thereof;
   a lower double arm of a parallel link system having a rotation axis identical to that of the upper double arm at one end thereof and disposed below the upper double arm;
   a cam box having a first drive shaft connected to the rotation axis of the upper double arm and supported rotatable and displaceable in vertical directions, a second drive shaft, coaxial with the first drive shaft, connected to the rotation axis of the lower double arm, and supported rotatable and displaceable in vertical directions, a third drive shaft connected coaxially to the first drive shaft; and
   a motor connected to the cam box for providing a first drive force to the first drive shaft and the second drive shaft to impart rotational movements of the upper double arm and the lower double arm to provide extension and retraction movements, and for providing a second drive force to the third drive shaft to impart upward and downward movements of the upper double arm and the lower double arm through the first drive shaft and the second drive shaft.

7. A wafer handling apparatus according to claim 6, wherein said first drive shaft and said second drive shaft are supported at their lower ends by respective magnetic couplings, said magnetic couplings being constructed with a permanent magnetic material.

8. A wafer handling apparatus according to claim 7, wherein the magnetic couplings comprise inner and outer pairs of magnetic wheels that are coaxially aligned about the first drive shaft.

9. The wafer handling apparatus according to claim 7 wherein the magnetic couplings are concentrically aligned inner and outer magnetic wheels.

10. The wafer handling apparatus according to claim 9 wherein the height of the inner and outer magnetic wheels are different to permit vertical adjustment.

11. The wafer handling apparatus according to claim 10 wherein magnetic wheels of different magnetic flux density are used to balance thrust applied through the magnetic wheels.

* * * * *